(12) United States Patent
Zheng et al.

(10) Patent No.: US 11,158,561 B2
(45) Date of Patent: Oct. 26, 2021

(54) MEMORY DEVICE WITH LOW DENSITY THERMAL BARRIER

(71) Applicant: Micron Technology, Inc., Boise, ID (US)

(72) Inventors: Pengyuan Zheng, Boise, ID (US); David Ross Economy, Boise, ID (US); Yongjun J. Hu, Boise, ID (US); Kent H. Zhuang, Boise, ID (US); Robert K. Grubbs, Boise, ID (US)

(73) Assignee: Micron Technology, Inc.

( * ) Notice: Subject to any disclaimer, the term of this patent is extended or adjusted under 35 U.S.C. 154(b) by 78 days.

(21) Appl. No.: 16/400,956

(22) Filed: May 1, 2019

(65) Prior Publication Data
US 2020/0350226 A1 Nov. 5, 2020

(51) Int. Cl.
| | |
|---|---|
| *H01L 23/373* | (2006.01) |
| *H01L 23/535* | (2006.01) |
| *H01L 21/768* | (2006.01) |
| *H01L 21/02* | (2006.01) |

(52) U.S. Cl.
CPC ...... *H01L 23/3736* (2013.01); *H01L 21/0234* (2013.01); *H01L 21/02186* (2013.01); *H01L 21/768* (2013.01); *H01L 23/535* (2013.01)

(58) Field of Classification Search
CPC .......... H01L 23/3736; H01L 21/02186; H01L 21/0234; H01L 21/768; H01L 23/535
See application file for complete search history.

(56) References Cited

U.S. PATENT DOCUMENTS

| | | | | |
|---|---|---|---|---|
| 9,159,579 | B2* | 10/2015 | Peng | H01L 21/321 |
| 9,847,221 | B1* | 12/2017 | McLaughlin | H01L 21/02164 |
| 9,865,456 | B1* | 1/2018 | Pandey | H01L 21/0228 |
| 10,483,099 | B1* | 11/2019 | Blanquart | H01L 21/76224 |
| 2004/0214430 | A1 | 10/2004 | Ruelke et al. | |
| 2006/0084279 | A1* | 4/2006 | Chang | H01L 21/31612 438/778 |
| 2006/0172552 | A1 | 8/2006 | Ajmera et al. | |
| 2008/0230916 | A1* | 9/2008 | Saito | H01L 21/76882 257/773 |
| 2014/0273530 | A1* | 9/2014 | Nguyen | H01L 21/0228 438/792 |
| 2015/0021770 | A1* | 1/2015 | Liou | H01L 21/768 257/751 |
| 2015/0021779 | A1* | 1/2015 | Liou | H01L 21/76883 257/773 |
| 2017/0103948 | A1 | 4/2017 | Lee et al. | |
| 2017/0271434 | A1* | 9/2017 | Chou | H01L 23/53238 |
| 2018/0019300 | A1* | 1/2018 | Lee | H01L 27/10805 |
| 2018/0182618 | A1* | 6/2018 | Blanquart | H01L 21/0234 |
| 2018/0301460 | A1 | 10/2018 | Yoo et al. | |

(Continued)

*Primary Examiner* — Peter Bradford
(74) *Attorney, Agent, or Firm* — Holland & Hart LLP

(57) ABSTRACT

Methods, systems, and devices related to a memory device with a thermal barrier are described. The thermal barrier (e.g., a low density thermal barrier) may be positioned between an access line (e.g., a digit line or a word line) and a cell component. The thermal barrier may be formed on the surface of a barrier material by applying a plasma treatment to the barrier material. The thermal barrier may have a lower density than the barrier material and may be configured to thermally insulate the cell component from thermal energy generated in the memory device, among other benefits.

11 Claims, 9 Drawing Sheets

(56) References Cited

U.S. PATENT DOCUMENTS

2019/0148398 A1    5/2019  Kim et al.
2019/0326214 A1   10/2019  Lin et al.
2020/0083345 A1*   3/2020  Canaperi ............... H01L 29/785

* cited by examiner

MEMORY DEVICE WITH LOW DENSITY THERMAL BARRIER

BACKGROUND

The following relates generally to forming, and more specifically to a memory device with a low density thermal barrier.

Memory devices are widely used to store information in various electronic devices such as computers, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

In some cases, a memory device may perform an access operation (e.g., a read operation or a write operation) on a memory cell. Performing the access operation may generate heat at or near the memory cell. The generated heat may dissipate onto nearby components, such as memory cells and, in some cases may disturb the states stored by the other memory cells.

DETAILED DESCRIPTION

Figure 1:
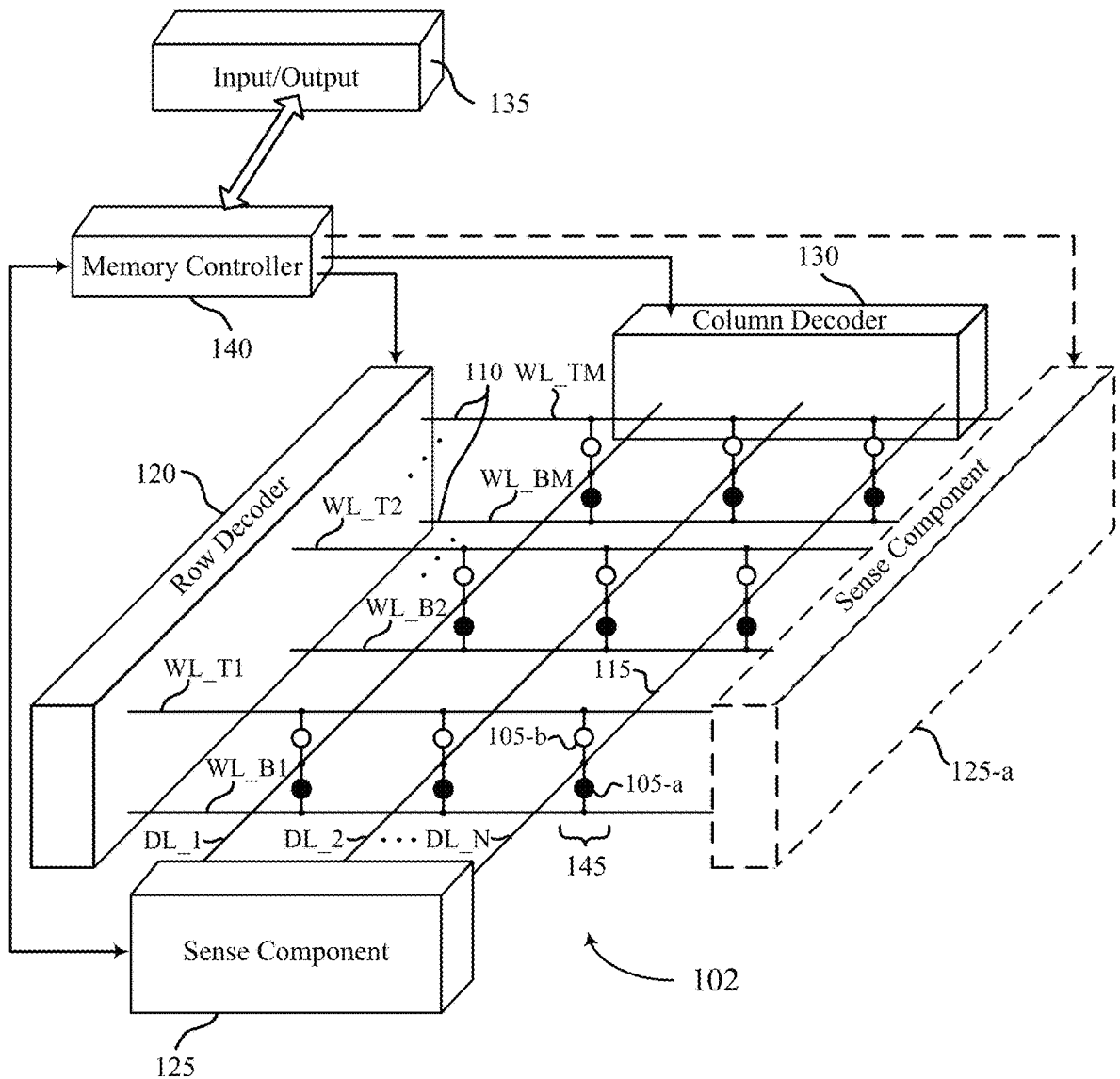
FIG. 1 illustrates an example of a memory device that supports a memory device with a low density thermal barrier in accordance with examples as disclosed herein.

A memory device may include one or more self-selecting memory cells composed of a number of components, such as cell components, arranged in a stack. The one or more cell components may be in contact with other components, such as electrodes. In some cases, the outermost electrodes may be in contact with barriers (e.g., tungsten silicon nitride (WSiN) barriers) which, in turn, may be contact with an access line (e.g., a word line or a digit line). The barriers may be configured to prevent molecular diffusion between an outermost electrode and a corresponding access line (e.g., the barriers may be examples of diffusion barriers). Additionally, the barrier may be configured to allow one or more electrical signals (e.g., a programming signal) to pass through the barrier.

Applying a signal (e.g., a programming signal or other signal) to a memory cell, however, may generate thermal energy (e.g., heat, such as latent heat) at the memory cell which may dissipate toward or onto other memory cells that are positioned in surrounding areas. The memory cell generating the thermal energy may be referred to as an aggressor cell and the memory cell onto which the thermal energy dissipates may be referred to as the victim cell in some contexts. The thermal energy may dissipate toward or onto the victim cell by (e.g., over) a thermally conductive material coupled with the memory cells, such as a digit line or a word line. When the thermal energy dissipates toward or onto the victim cell, the thermal energy may cause the victim cell to transition one or more states stored by the victim cell, which may be referred to as thermal disturb. The barrier may be configured to thermally insulate, at least partially, the memory cells from thermally conductive materials. The thermal conductivity of the barrier may depend at least in part on the density of the barrier (e.g., a higher density of WSiN may lead to a higher thermal conductivity which, in turn, may enable a greater amount of thermal disturb).

The electrical resistivity of some barriers (e.g., WSiN barriers) may vary based on one or more factors, such as the temperature. For example, fluctuations in temperature caused by thermal energy may enable some threshold voltages ($V_T$) to shift, may change amperage of programming currents (e.g., a reset current ($I_{reset}$)), may cause inconsistent programming efficiency (e.g., a fluctuating amount of read disturb), or a combination thereof. Read disturb may, for instance, involve the release of parasitic charge during a reading and may be mitigated by increasing electrical resistance of the barriers. Additionally or alternatively, the resistivity (whether thermal or electrical) of some barriers (e.g., those containing WSiN) may be limited under some formation methods (e.g., physical vapor deposition (PVD)).

To mitigate thermal disturb and/or to stabilize the resistivity of the barrier, a low density portion of a barrier material may be formed that is configured to provide thermal insulation for a self-selecting memory cell. The low density portion may be formed by depositing the barrier material (e.g., via physical vapor deposition (PVD)) and applying a plasma treatment to the deposited barrier material. Applying the plasma to the barrier material may form the low density portion at the exposed surface of the barrier material. In some cases, as merely examples, the plasma may be created from dinitrogen and helium molecules. In cases where the barrier material is WSiN, the low density portion may also be WSiN. But the low density portion may have a greater proportion of tungsten-nitride bonds relative to the deposited barrier material. Additionally or alternatively, the low density portion may have a lower proportion of tungsten-silicon bonds relative to the deposited barrier material. These proportions may decrease the density of the low density portion, stabilize the resistivity (e.g., thermal or electrical), increase the resistivity (e.g., thermal or electrical) relative to the deposited barrier material, or a combination thereof.

Features of the disclosure are initially described in the context of a memory device. Specific examples are then described in the context of a memory array, a memory cell, a manufacturing process, and plasma application processes. These and other features of the disclosure are further illustrated by and described with reference to flowcharts that relate to a memory device with a low density thermal barrier.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102, although the teachings herein may also be used to form a 2D (single deck) memory array (among other device types). The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states (e.g., a multi-level cell). A memory cell 105 may, in some examples, include a self-selecting memory cell, a 3D XPoint™ memory cell, a PCM cell that includes a storage component and a selection component, a conductive-bridge RAM (CBRAM) cell, or a FeRAM cell. The memory array 102 may be positioned above a substrate that includes various circuitry, such as the row decoder 120, the sense component 125, the column decoder 130, complementary metal-oxide-semiconductor (CMOS) under the array (not shown), or the like. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 (e.g., memory cells 105-a and 105-b) and may thus be considered a 3D memory array; however, the number of levels is not limited to two (e.g., $2^N$ levels where N=2, 3, 4, 5 . . . ). Each level may be aligned or positioned so that memory cells 105 may be aligned (exactly, overlapping, or approximately) with one another across each level, forming a memory cell stack 145. In some cases, levels of memory cells may be referred to as decks of memory cells. In some cases, the memory cell stack 145 may include multiple self-selecting memory cells laid on top of another while sharing an access line for both. In some cases, the self-selecting memory cells may be multi-level self-selecting memory cells configured to store more than one bit of data using multi-level storage techniques.

In some examples, each row of memory cells 105 is connected to a word line 110, and each column of memory cells 105 is connected to a digit line 115. Access lines may refer to either word lines 110, digit lines 115, or both. Word lines 110 and digit lines 115 may be substantially perpendicular to one another and may create an array of memory cells. As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer.

In general, one memory cell 105 may be located at the intersection of two conductive lines such as a word line 110 and a digit line 115. This intersection may be referred to as a memory cell's address. A target memory cell 105 may be a memory cell 105 located at the intersection of an energized word line 110 and digit line 115; that is, word line 110 and digit line 115 may be energized to read or write a memory cell 105 at their intersection. Other memory cells 105 that are in electronic communication with (e.g., connected to) the same word line 110 or digit line 115 may be referred to as untargeted memory cells 105.

As discussed above, electrodes may be coupled to a memory cell 105 and a word line 110 or a digit line 115. The term electrode may refer to an electrical conductor (e.g., a conductive material), and in some cases, may be employed as an electrical contact to a memory cell 105. An electrode may include a trace, wire, conductive line, conductive layer, or the like that provides a conductive path between elements or components of memory device 100. In some examples, a memory cell 105 may include one or more chalcogenide materials (e.g., germanium-antimony-tellurium (GST)) positioned between a first electrode and a second electrode. One side of the first electrode may be coupled to a word line 110 and the other side of the first electrode to one of the one or more chalcogenide materials. In addition, one side of the second electrode may be coupled to a digit line 115 and the other side of the second electrode to one of the one or more chalcogenide materials. The first electrode and the second electrode may be the same material (e.g., carbon) or different. In some cases, one or both of the word line 110 and the digit line 115 may be in contact with a first and second barrier in contact with the first electrode and the second electrode, respectively.

Operations such as reading and writing may be performed on memory cells 105 by activating or selecting word line 110 and digit line 115. In some examples, digit lines 115 may also be known bit lines 115. Additionally or alternatively, either or both of word line 110 and digit line 115 may be referred to as an access line. References to access lines, word lines, and digit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and digit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, sense component 125 may read information stored in a selected memory cell 105 by detecting the current flow or lack thereof through the memory cell 105.

Sense component 125 may include various transistors or amplifiers to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming signal to the self-selecting memory cell.

In some cases, applying a signal to the self-selecting memory cell may generate thermal energy. When a memory cell 105 includes a low density barrier material as described herein, the low density barrier material may be configured to thermally insulate the self-selecting memory cell and may prevent the generated thermal energy from dissipating onto or toward other memory cells 105 or other components.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and digit line 115. Memory controller 140 may also generate and control various voltages or currents used during the operation of memory device 100.

Figure 2:
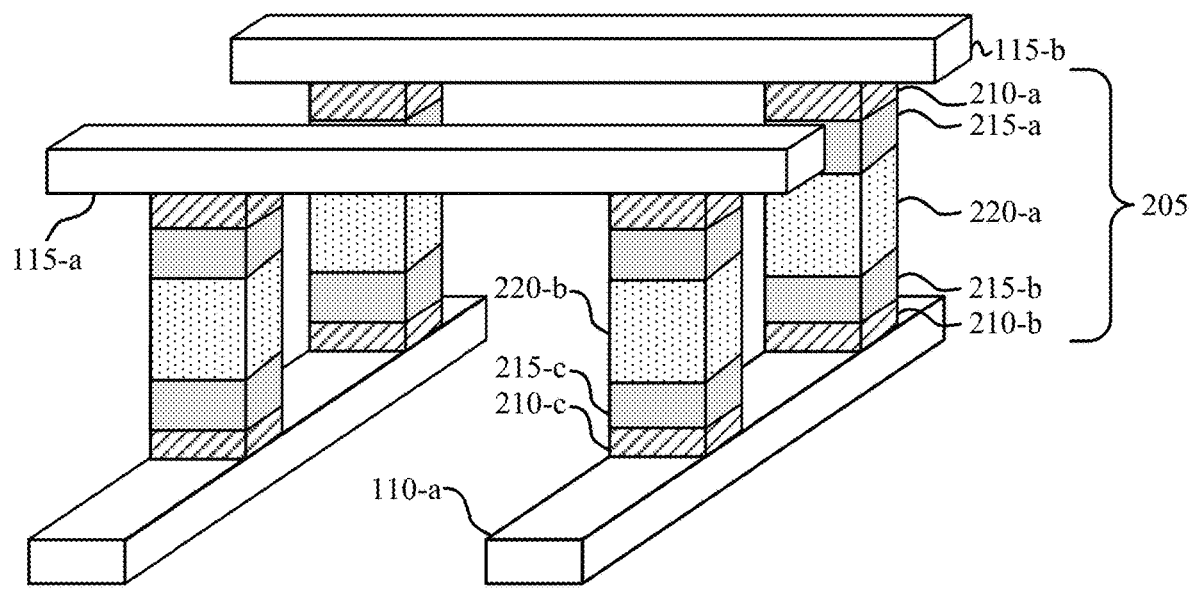
FIG. 2 illustrates an example of a memory array that supports a memory device with a low density thermal barrier in accordance with examples as disclosed herein.
Figure 2:
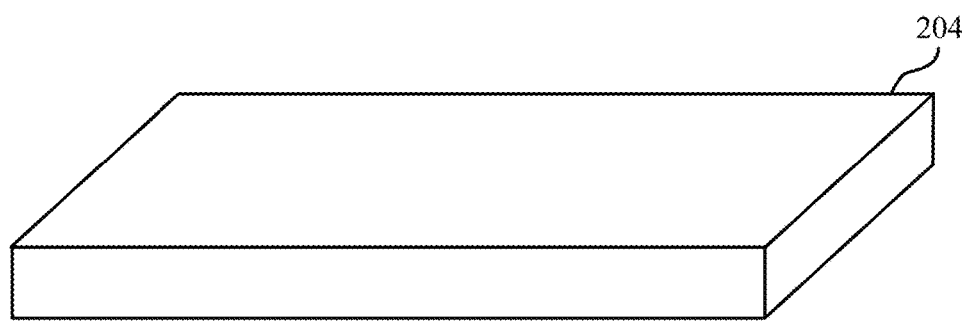

FIG. 2 illustrates an example of a memory array 200 that supports techniques for a memory device with a low density thermal barrier in accordance with examples of the present disclosure. Memory array 200 may be an example of portions of memory array 102 described with reference to FIG. 1. Memory array 200 may include an array or deck 205 of memory cells that is positioned above a substrate 204. Memory array 200 may also include word line 110-a, word line 110-b, and digit line 115-a which may be examples of word lines 110 and a digit line 115, as described with reference to FIG. 1. Memory cells of the deck 205 each may have one or more cell components 220. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the deck 205 may include a barrier 210-a, an electrode 215-a, a cell component 220-a, an electrode 215-b, and a barrier 210-b. In some cases, the memory array 200 may include a second array or deck 205 of memory cells on top of the array or deck 205. The memory cells of the first and seconds decks 205 may have common conductive lines such that corresponding self-selecting memory cells of each deck 205 may share digit lines 115 or word lines 110 as described with reference to FIG. 1. For example, a barrier 210 of the second deck 205 and barrier 210-a of the first deck 205 may be coupled to digit line 115-a such that digit line 115-a is shared by vertically adjacent self-selecting memory cells. A memory cell of the second deck 205 may consist of barriers 210, electrodes 215, and cell components 220 and may be connected to a word line 110 and a digit line 115. For instance, a memory cell of the second deck may include a first barrier 210 in contact with digit line 115-a, a first electrode 215 in contact with the first barrier 210, a cell component 220 in contact with the first electrode 215, a second electrode 215 in contact with the cell component 220, and a second barrier 210 in contact with the second electrode 215 and a word line 110 over the second barrier 210.

In some cases, cell component 220-a may consist of multiple cell components 220 (e.g., multiple cell components 220 made of chalcogenide material) in contact with electrode 215-a and electrode 215-b. For instance, a first cell component 220 may be in contact with electrode 215-a and a second cell component 220 may be in contact with electrode 215-b. Another electrode 215 may be placed in between the first and second cell components 220 and the first and second cell component 220 may be in contact with the electrode 215. A similar replacement may happen for the second deck 205 (e.g., the cell component 220 may be replaced with a first cell component 220 in contact with the first electrode 215, a second cell component 220 in contact with the second electrode 215, and a third electrode 215 in between the first and second cell components 220). Additionally or alternatively, one or both of barriers 210-a and 210-b may be omitted. If barrier 210-a is omitted, electrode 215-a may be in contact with word line 110-a, and if barrier 210-b is omitted, electrode 215-b may be in contact with digit line 115-a. Similar omissions may occur with regards to the second deck 205 (e.g., the first barrier 210 may be omitted and the first electrode 215 may be in contact with digit line 115-a and/or the second barrier 210 may be omitted and the second electrode 215 may be in contact with a word line 110).

The architecture of memory array 200 may be referred to as a cross-point architecture, in some cases, in which a memory cell is formed at a topological cross-point between a word line and a digit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures.

While the example of FIG. 2 shows one deck 205, other configurations are possible. For instance, as mentioned above, a second deck 205 may be constructed above the first deck 205, which may be referred to as a two-dimensional memory. In some examples, three, four, or a greater number of decks 205 of memory cells may be configured in a similar manner in a three-dimensional cross point architecture. For instance, a third deck 205 may be arranged like the first deck 205 and a fourth deck 205 may be arranged like the second deck 205. In general, each deck 205 may alternate between being in a configuration of the first deck 205 and the second deck 205 (e.g., a fifth deck 205 may be arranged like the first deck 205 and a sixth deck 205 may be arranged like the second deck 205).

In some examples, cell component 220 may be a chalcogenide material. Each cell component 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), gallium (Ga), or fluorine (F), each in atomic or molecular forms.

In some examples, a self-selecting memory cell including one or more cell components 220 may be programmed to a logic state by applying a programming signal to a barrier 210. The barrier 210 may pass the programming signal to an electrode 215 which, in turn, may pass the programming signal to the cell component 220. Providing programming signals to the cell component 220 may store data (e.g., one or more logic values at the cell component 220). For instance, if the cell component 220 receives a programming signal of a first polarity, the cell component 220 may store a logic '0' and if the cell component receives a programming signal of a second polarity, the cell component 220 may store a logic '1'.

Applying a programming signal to the cell component 220 may generate thermal energy (e.g., heat) and may dissipate the thermal energy onto a neighboring or adjacent cell component 220. For instance, if a programming signal is applied to cell component 220-a, cell component 220-a may generate thermal energy. The thermal energy from cell component 220-a may conduct through electrode 215-a, barrier 210-a, and onto digit line 115-b. Digit line 115-b may pass the thermal energy to a barrier 210 in contact with the digit line 115-b (e.g., a barrier 210 directly above barrier 210-a). The barrier 210 may pass the thermal energy to a corresponding electrode 215, which may pass the thermal energy onto a corresponding cell component 220 (e.g., a cell component 220 directly above cell component 220-a). The dissipated thermal energy may cause or enable the corresponding cell component 220 to errantly undergo a transition from a first resistance state to a second resistance state (e.g., from a high resistance state to a low resistance state), a transition from a first solid state to a second solid state (e.g., from an amorphous state to a crystalline state), a transition from a reset state to a set state, or a combination thereof. This errant transition may be an example of programming disturb.

Additionally or alternatively, the thermal energy from cell component 220-a may conduct through electrode 215-b, barrier 210-b, word line 110-a, barrier 210-c, and electrode 215-c and may dissipate onto cell component 220-b. The dissipated thermal energy may cause or enable cell component 220-b to errantly undergo a transition from a first resistance state to a second resistance state (e.g., from a high resistance state to a low resistance state), a transition from a first solid state to a second solid state (e.g., from an amorphous state to a crystalline state), a transition from a reset state to a set state, or a combination thereof. In cases where cell component 220-a is replaced by multiple cell components 220, some or all of the cell components may generate thermal energy. For instance, a first cell component 220 in contact with electrode 215-a may generate thermal energy which is imparted onto barrier 210-a and a second cell component 220 in contact with electrode 215-b may generate thermal energy which is imparted onto barrier 210-b. In a similar manner, if the other cell component 220 and/or cell component 220-b are replaced by multiple cell components 220, some or all of the multiple cell components 220 may similarly receive the thermal energy. For instance, a first cell component 220 in contact with electrode 215-c may receive thermal energy passed along word line 110-a.

In some cases, a barrier 210 may provide thermal insulation between a word line 110 or digit line 115 and an electrode 215. The thermal insulation may, for instance, be provided by a low density barrier material. In one case, if a programming signal is applied to cell component 220-a and barrier 210-a includes thermal insulation, electrode 215-a may still conduct the generated thermal energy, but barrier 210-a may mitigate the amount of thermal energy passed to digit line 115-b (e.g., cell component 220-a may have a minimal thermal influence on digit line 115-b). Additionally, if another barrier 210 that is in contact with digit line 115-b (e.g., a barrier 210 directly above barrier 210-a) includes thermal insulation, that barrier 210 may mitigate the amount of thermal energy passed to a corresponding electrode 215 and, by extension, a corresponding cell component 220. Additionally or alternatively, if a programming signal is applied to cell component 220-a and barrier 210-b includes thermal insulation, electrode 215-b may still conduct the generated thermal energy, but barrier 210-b may mitigate the amount of thermal energy passed to word line 110-a. Additionally, if barrier 210-c includes thermal insulation, barrier 210-c may mitigate the amount of thermal energy passed to electrode 215-c and, by extension, cell component 220-b. In cases where cell component 220-a is replaced by multiple cell components 220, barriers 210-a and/or 210-b may similarly provide thermal insulation and may mitigate the amount of thermal energy passed to digit line 115-b or word line 110-a. In cases where the cell component 220 corresponding to the other barrier 210 and/or cell component 220-b are replaced by single memory material(s), the other barrier 210 and/or barrier 210-c may similarly provide thermal insulation and may mitigate the amount of thermal energy passed to the cell component 220 corresponding to the other barrier 210 and/or cell component 220-b.

Additionally or alternatively, the electrical resistivity of a barrier 210 may fluctuate by a factor (e.g., 2 or 3 times) as a corresponding cell component 220 generates thermal energy. For instance, cell component 220-a may receive a programming signal from digit line 115-b. As cell component 220-a receives the programming signal, cell component 220-a may generate thermal energy. Cell component 220-a may impart the thermal energy onto barrier 210-a and may cause the electrical resistivity of to go down. After receiving the programming signal, cell component 220-a may release or dissipate thermal energy (e.g., cell component 220-a may cool down). While cell component 220-a releases thermal energy, barrier 210-a may also release or dissipate thermal energy. As barrier 210-a releases or dissipates thermal energy, the electrical resistivity of barrier 210-a may increase. However, the trajectory that the electrical resistivity of barrier 210-a follows as barrier 210-a releases or dissipates thermal energy may not match the trajectory that the electrical resistivity of barrier 210-a follows as barrier 210-a receives thermal energy (e.g., from cell component 220-a). Such fluctuations may result in a shift in $V_T$, programming current (e.g., $I_{reset}$), or amount of read disturb. A similar situation may occur with regards to barrier 210-b. In cases where cell component 220-a is replaced by multiple cell components 220, some or all of the multiple cell components 220 (e.g., the cell components 220 in contact with electrodes 215-a and 215-b) may similarly release or dissipate thermal energy.

Figure 3:
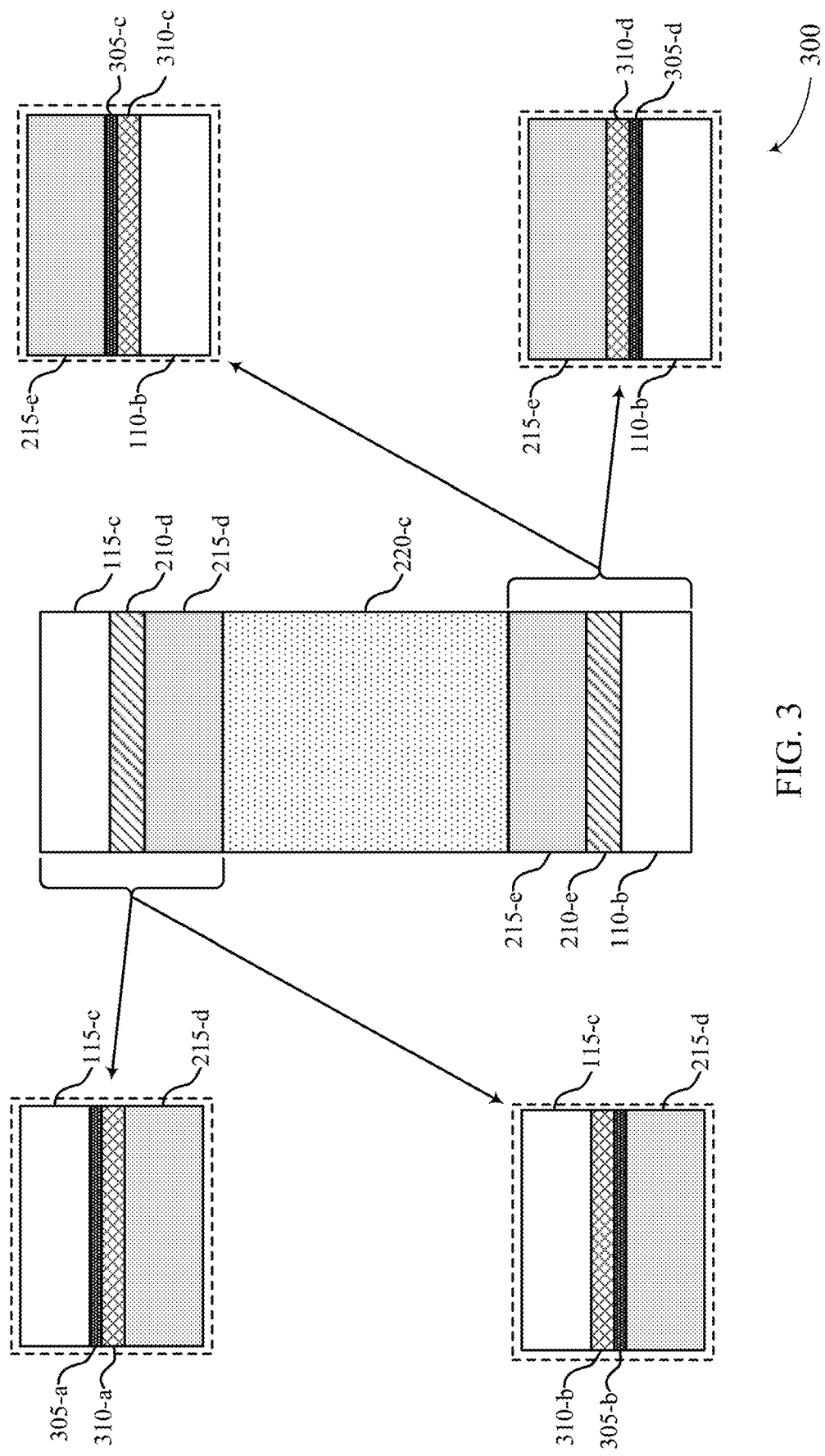
FIG. 3 illustrates an example of a memory cell that supports a memory device with a low density thermal barrier in accordance with examples as disclosed herein.

FIG. 3 illustrates an example of a memory cell 300 that supports a memory device with a low density thermal barrier in accordance with examples of the present disclosure. In some examples, memory cell 300 may be an example of a memory cell within a first deck 205 or a second deck 205 as described with reference to FIG. 2. Memory cell 300 may include a digit line 115-c, a barrier 210-d, an electrode 215-d, a cell component 220-c, an electrode 215-e, a barrier 210-e, and a word line 110-b, each of which may be an example of a digit line 115, a barrier 210, an electrode 215, a cell component 220, or a word line 110 as described with reference to FIG. 2. In some cases, cell component 220-c may be replaced by multiple cell components 220 (e.g., multiple cell components 220 composed of chalcogenide materials). For instance, a first cell component 220 may be in contact with electrode 215-d and a second cell component 220 may be in contact with electrode 215-e. Additionally, an electrode 215 may be located between the first cell component 220 and the second cell component 220.

In some cases, barrier 210-d may include a low density barrier material 305 and a barrier 310. In one example, memory cell 300 may include a low density barrier material 305-a between barrier 310-a and digit line 115-c. In another example, memory cell 300 may include a low density barrier material 305-b in between barrier 310-b and electrode 215-d. In some examples, low density barrier materials 305-a or 305-b may be formed from barrier 210-d (e.g., via the manufacturing process described with reference to FIG. 4). For instance, a plasma may be applied to a material of barrier 210-e and low density barrier materials 305 and barriers 310 may result from the application of the plasma. In such examples, low density barrier materials 305-a and 305-b may be considered a modified portion of barrier 210-d and barriers 310-a and 310-b may be considered a remaining portion of barrier 210-d (e.g., a non-modified portion of barrier 210-d). In such cases, barriers 310-a and 310-b may have a same density as barrier 210-d. Alternatively, barriers 310-a and 310-b may be modified by application of the plasma and may have a higher density than barrier 210-d. In other examples, low density barrier materials 305-a or 305-b may be formed independently of barriers 310-a or 310-b (e.g., via PVD, CVD, ALD, or other depositing methods). In other examples, barriers 310-a or 310-b may not be included (e.g., barriers 310-a or 310-b may not be included as an underlayer of low density barrier materials 305-a or 305-b) and low density barrier material 305-a or 305-b, respectively, may be in direct contact with electrode 215-d and digit line 115-c. Alternatively, barrier 210-d may not be included and electrode 215-d may be in contact with digit line 115-c.

In some examples, whether barrier 210-d includes a low density barrier material 305-a, a low density barrier material 305-b, both, or neither may depend on a location of the corresponding memory cell 300 within the memory device. For instance, if the memory cell 300 is within a first deck 205 as described with reference to FIG. 2, the barrier 210-d may include low density barrier material 305-a, low density barrier material 305-b, both, or neither. If memory cell 300 is within a second deck 205 as described with reference to FIG. 2, barrier 210-d may include a low density barrier material 305-a, low density barrier material 305-b, both or neither. In one embodiment, if a material of word line 110-b is formed before a material of digit line 115-c and memory cell 300 is within a first deck 205 as described with reference to FIG. 2, barrier 210-d may include low density barrier material 305-a. In another embodiment, if a material of digit line 115-c is formed before a material of word line 110-b and memory cell 300 is within a first deck 205 as described with reference to FIG. 2, barrier 210-d may include low density barrier material 305-b. In another embodiment, if a material of word line 110-b is formed before a material of digit line 115-c and memory cell 300 is within a second deck 205 as described with reference to FIG. 2, barrier 210-d may include low density barrier material 305-b. In another embodiment, if a material of digit line 115-c is formed before a material of word line 110-b and memory cell 300 is within a second deck 205 as described with reference to FIG. 2, barrier 210-f may include low density barrier material 305-a.

In some cases, the low density barrier material 305 of barrier 210-d may have a bilayer structure. In one example (e.g., when utilizing low density barrier material 305-a), a first layer of the bilayer (e.g., a surface layer in contact with digit line 115-c) may be richer (e.g., denser) in tungsten than a second layer of the bilayer (e.g., a bulk layer in contact with electrode 215-d). In another example (e.g., when utilizing low density barrier material 305-b), a first layer of the bilayer (e.g., a surface layer in contact electrode 215-d) may be richer (e.g., denser) in tungsten than a second layer of the bilayer (e.g., a bulk layer in contact with digit line 115-c). In either example, the first layer may be thinner than the second layer. The bilayer may have an overall density less than barrier 210-d, barrier 310-a and/or barrier 310-b.

In some cases, barrier 210-e may include a low density barrier material 305 and a barrier 310. In one example, memory cell 300 may include a low density barrier material 305-c between barrier 310-c and electrode 215-e. In another example, memory cell 300 may include a low density barrier material 305-d in between barrier 310-d and word line 110-b. In some examples, low density barrier materials 305-c or 305-d may be formed from barrier 210-e (e.g., via the manufacturing process described in FIG. 4). For instance, a plasma may be applied to a material of barrier 210-e and low density barrier materials 305 and barriers 310 may result from the application of the plasma. In such examples, low density barrier materials 305-c and 305-d may be considered a modified portion of barrier 210-e and barriers 310-c and 310-d may be considered a remaining portion of barrier 210-e (e.g., a non-modified portion of barrier 210-e). In such cases, barriers 310-c and 310-d may have a same density as barrier 210-e. Alternatively, barriers 310-c and 310-d may be modified by application of the plasma and may have a higher density than barrier 210-e. In other examples, low density barrier materials 305-c or 305-d may be formed independently of barriers 310-c or 310-d (e.g., via PVD, CVD, ALD, or other depositing methods). In other examples, barriers 310-c or 310-d may not be included (e.g., barriers 310-c or 310-d may not be included as an underlayer of low density barrier materials 305-c or 305-d) and low density barrier material 305-c or 305-d, respectively, may be in direct contact with electrode 215-e and word line 110-b. Alternatively, barrier 210-e may not be included and electrode 215-e may be in contact with word line 110-b.

In some examples, whether barrier 210-e includes a low density barrier material 305-c, a low density barrier material 305-d, both, or neither may depend on a location of the corresponding memory cell 300 within the memory device. For instance, if the memory cell 300 is within a first deck 205 as described with reference to FIG. 2, the barrier 210-e may include low density barrier material 305-c, low density barrier material 305-d, both, or neither. If memory cell 300 is within a second deck 205 as described with reference to FIG. 2, barrier 210-e may include a low density barrier material 305-c, low density barrier material 305-d, both or neither. In one embodiment, if a material of word line 110-b is formed before a material of digit line 115-c and memory cell 300 is within a first deck 205 as described with reference to FIG. 2, barrier 210-e may include low density barrier material 305-c. In another embodiment, if a material of digit line 115-c is formed before a material of word line 110-b and memory cell 300 is within a first deck 205 as described with reference to FIG. 2, barrier 210-e may include low density barrier material 305-d. In another embodiment, if a material of word line 110-b is formed before a material of digit line 115-c and memory cell 300 is within a second deck 205 as described with reference to FIG. 2, barrier 210-e may include low density barrier material 305-d. In another embodiment, if a material of digit line 115-c is formed before a material of word line 110-b and memory cell 300 is within a second deck 205 as described with reference to FIG. 2, barrier 210-e may include low density barrier material 305-c.

Additionally or alternatively, the low density barrier material 305 of barrier 210-e may have a bilayer structure. In one example (e.g., with regards to low density barrier material 305-c), a first layer of the bilayer (e.g., a surface layer in contact with electrode 215-e) may be richer (e.g., denser) in tungsten than a second layer of the bilayer (e.g., a layer in contact with word line 110-b). In another example (e.g., with regards to low density barrier material 305-d), a first layer of the bilayer (e.g., a surface layer in contact with word line 110-b) may be richer (e.g., denser) in tungsten than a second layer of the bilayer (e.g., a bulk layer in contact with electrode 215-e). In either example, the first layer may be thinner than the second layer. The bilayer may have an overall density less than barrier 210-e, barrier 310-c and/or barrier 310-d.

In general, low density barrier material 305-a may be implemented concurrently with low density barrier material 305-c, low density barrier material 305-d, neither, or both. Additionally or alternatively, low density barrier material 305-b may be implemented concurrently with low density barrier material 305-c, low density barrier material 305-d, neither, or both. Additionally or alternatively, low density barrier material 305-c may be implemented concurrently with low density barrier material 305-a, low density barrier material 305-b, neither, or both. Additionally or alternatively, low density barrier material 305-d may be implemented concurrently with low density barrier material 305-a, low density barrier material 305-b, neither, or both.

Both low density barrier material 305 and their corresponding barriers 310 may be composed of WSiN. However, a low density barrier material 305 may have a greater proportion of tungsten-nitrogen bonds relative to size (e.g., a greater density of tungsten-nitrogen bonds) than a corresponding barrier 310 (e.g., low density barrier material 305-a may have a greater proportion of tungsten-nitrogen bonds than barrier 310 relative to size). Additionally or alternatively, a low density barrier material 305 may have a smaller proportion of tungsten-silicon bonds relative to size (e.g., a smaller density of tungsten-silicon bonds) than a corresponding barrier 310.

The low density barrier material 305 may have a lower density than barrier 310. This difference in density may be due, for instance, to the increased proportion of tungsten-nitrogen bonds or the decreased proportion of tungsten-silicon bonds relative to the low density barrier material 305. A lower density of the low density barrier material 305 may lead to a reduced thermal conductivity of relative to a corresponding barrier 310. This reduced thermal conductivity, may reduce programming disturbances of the state stored on neighboring memory cells. Additionally or alternatively, the low density barrier material 305 may have a more stable electrical resistivity when subjected to thermal energy, which may enable more consistent programming efficiency (e.g., more consistent values of $I_{reset}$, $V_T$, and read disturb) relative to a barrier 310 alone. For instance, changes in electrical resistivity in between heating and cooling cycles may be more consistent (e.g., closer to following a single trajectory) as compared to barrier 310. The increased thermal stability may be due to the to the increased proportion of tungsten-nitrogen bonds relative to the low density barrier material 305. In some cases, increased stability may increase the reliability of a corresponding electrode 215 and may increase an endurance of a memory device (e.g., memory device 100) associated with the memory cell 300. Additionally or alternatively, the low density barrier material 305 may have a higher electrical resistivity at elevated temperatures than the low density barrier material 305.

Figure 4:
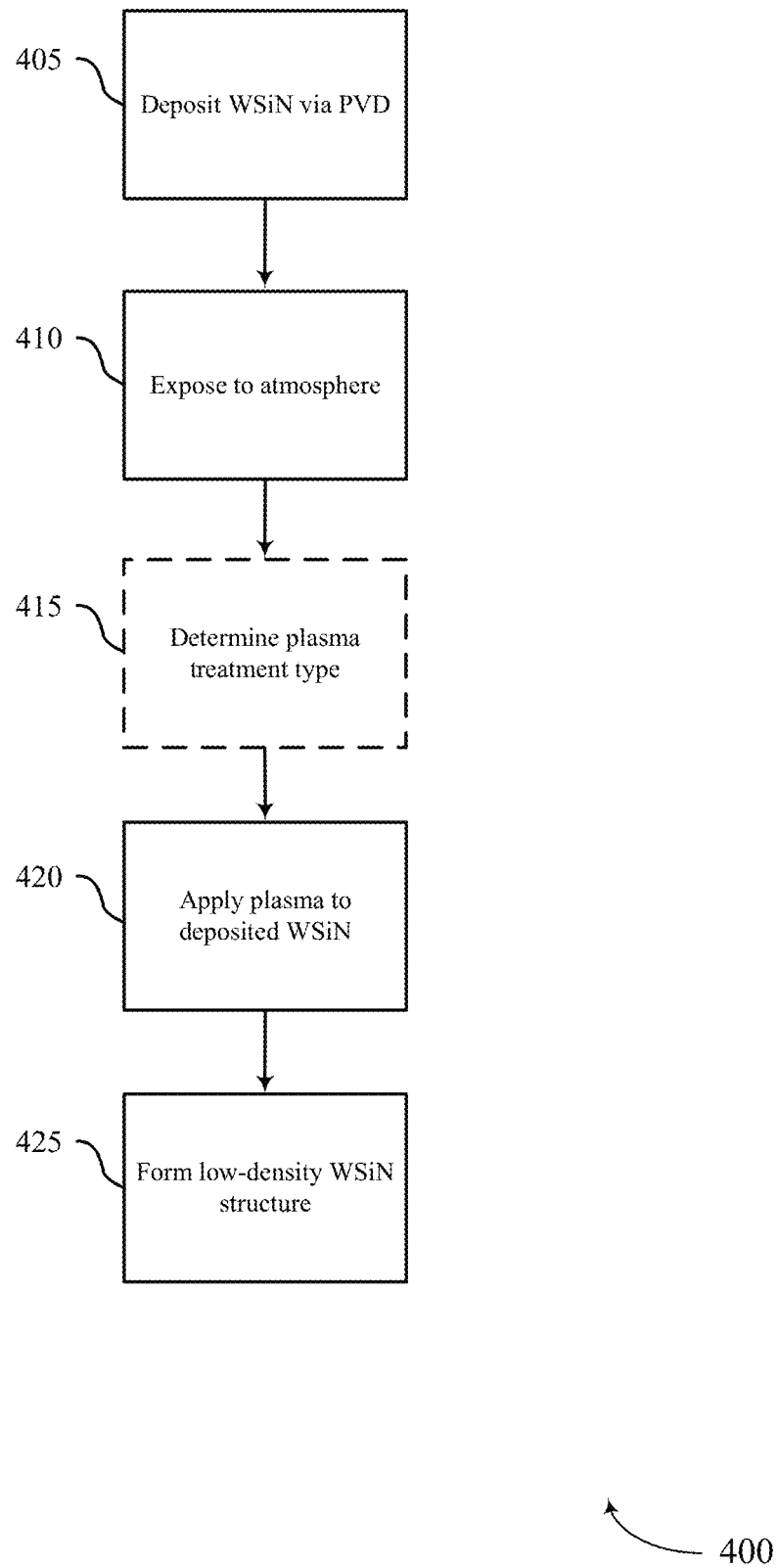
FIG. 4 illustrates an example of a manufacturing process that supports a memory device with a low density thermal barrier in accordance with examples as disclosed herein.

FIG. 4 illustrates an example of a manufacturing process 400 that supports a memory device with a low density thermal barrier in accordance with examples of the present disclosure.

At 405, the barrier material may be deposited using PVD (e.g., direct current (DC) magnetron PVD, which may also be known as reactive sputtering). The plasma used in PVD may be a plasma created from argon and dinitrogen molecules (e.g., the PVD may be an $N_2$ reactive PVD). Additionally, the material targeted by the plasma may consist of tungsten and silicon. For instance, the material may be a $WSi_X$ material, where X may refer to a proportion of silicon atoms relative to tungsten atoms in the targeted material. In general X may be a value of anywhere between or equal to 2 and 4. For instance, X may be equal to 2, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0. In some cases, the barrier material may be deposited via chemical vapor deposition (CVD), atomic layer deposition (ALD), or any other deposition method. In some cases, the barrier material may be deposited onto a semiconductor substrate.

At 410, the deposited barrier material may be exposed to atmosphere. Exposing the deposited barrier material to atmosphere may involve a deposition chamber containing the barrier to allow air to enter the deposition chamber. In some cases, the deposition chamber may first create a vacuum to pump out the gas used to create the PVD plasma and may then expose the deposited barrier material to atmosphere. Atmosphere, in the present case, may refer to air located locally around the deposition chamber (e.g., air within a room that contains the deposition chamber) or may refer to air pumped in or otherwise collected from a distance (e.g., air from outside of the room). Although the present example assumes that the deposited barrier material may be exposed to air, it is possible that the deposited barrier material may be exposed to other gases or particular constituents of air (e.g., nitrogen, dinitrogen, oxygen, dioxygen, water vapor, argon, or carbon dioxide). In some cases, 410 may not be performed and 415 or 420 may directly follow 405. Such cases, in which 415 or 420 directly follows 405, may be referred to as in-situ back-to-back processes.

At 415, it may be determined (e.g., by a controller of the deposition chamber or based on one or more other components or readings) what type of plasma treatment to apply to the deposited barrier material. Different types of plasma treatments may use different times of treatment, different deposition chamber temperature functions, different deposition chamber pressure functions, different amounts of constituent molecules (e.g., dinitrogen or helium) used up to make the plasma of the plasma treatment, different plasma powers, or a combination thereof. In some cases, the type of plasma treatment may be determined based on an expected density of a low density barrier material, an expected thickness of the low density barrier material, an expected atomic ratio of tungsten-nitrogen bonds to tungsten-silicon bonds in the low density barrier material, an expected proportion of chemical constituents of the low density barrier material, an expected electrical resistivity of a low density barrier material, or a combination thereof. Additionally or alternatively, different types of plasma treatments may be used under different process conditions.

The type of plasma treatment and/or the thickness of the deposited barrier material may affect a density and/or a thickness of a resulting low density barrier material. In one example, a 150 angstroms (Å) barrier material may be deposited and may initially have an initial density and no low density barrier material. The initial density may be between 6.356 and 7.156 grams per cubic centimeters (g/cc), 6.456 and 7.056 g/cc, 6.556 g/cc and 6.956 g/cc, 6.656 g/cc and 6.856 g/cc, or may be about 6.756 g/cc. A first plasma treatment on the deposited barrier material of 150 Å may result in a low density barrier material or a layer of a bilayer (e.g., a bulk layer) with a first density and a first low density barrier material thickness. For instance, the first low density barrier material thickness may be between 61 Å and 69 Å, 62 Å and 68 Å, 63 Å and 67 Å, 64 Å and 66 Å, or may be about 65 Å and the first density may be between 3.3 g/cc and 4.1 g/cc, 3.4 g/cc and 4.0 g/cc, 3.5 g/cc and 3.9 g/cc, 3.6 g/cc and 3.8 g/cc, or may be about 3.7 g/cc. A second plasma treatment on the deposited barrier material of 150 Å may result in a low density barrier material or a layer of a bilayer with a second density and a second low density barrier material thickness. For instance, the second low density barrier material thickness may be between 74.4 Å and 82.4 Å, 75.4 Å and 81.4 Å, 76.4 Å and 80.4 Å, 77.4 Å and 79.4 Å, or may be about 78.4 Å and the second density may be between 3.12 g/cc and 3.92 g/cc, 3.22 g/cc and 3.82 g/cc, 3.32 g/cc, and 3.72 g/cc, 3.42 g/cc and 3.62 g/cc, or may be about 3.52 g/cc.

In another example, a 50 Å barrier material may be deposited and may have an initial density and no low density barrier material. The initial density may be between 6.365 and 7.165, 6.465 and 7.065, 6.565 and 6.965, 6.655 and 6.865, or may be about 6.765 g/cc. The first plasma treatment on the deposited barrier material of 50 Å may result in a low density barrier material or a layer of a bilayer (e.g., a bulk layer) with a first density and a first low density barrier material thickness. The first density may be between 3.35 g/cc and 4.15 g/cc, 3.45 g/cc and 4.05 g/cc, 3.55 g/cc and 3.95 g/cc, 3.65 g/cc and 3.85 g/cc, or may be about 3.75 g/cc. The second plasma treatment on the deposited barrier material of 50 Å may result in a low density barrier material or a layer of a bilayer (e.g., a bulk layer) with a second density and a second low density barrier material thickness. The second density may be between 3.11 g/cc and 3.91 g/cc, 3.21 g/cc and 3.81 g/cc, 3.31 g/cc and 3.71 g/cc, 3.41 g/cc and 3.61 g/cc, or may be about 3.51 g/cc.

Additionally or alternatively, the type of plasma treatment and/or the thickness of the deposited barrier material may affect an atomic ratio of tungsten-nitrogen bonds to tungsten-silicon bonds within the resulting low density barrier material. In one example, a 150 Å barrier material may be deposited and may have an initial atomic ratio between 0.31 and 0.39, 0.32 and 0.38, 0.33 and 0.37, 0.34 and 0.36, or may be about 0.35. A first plasma treatment on the deposited barrier material of 150 Å may result in a low density barrier material or a layer of a bilayer (e.g., a bulk layer) with an atomic ratio between 0.42 and 0.50, 0.43 and 0.49, 0.44 and 0.48, 0.45 and 0.47, or may be about 0.46. A second plasma treatment on the deposited barrier material of 150 Å may result in a low density barrier material or a layer of a bilayer (e.g., a bulk layer) with an atomic ratio between 1.32 and 1.40, 1.33 and 1.39, 1.34 and 1.38, 1.35 and 1.37, or may be about 1.36.

In another example, a 50 Å barrier material may be deposited and may have an atomic ratio between 0.33 and 0.41, 0.34 and 0.40, 0.35 and 0.39, 0.36 and 0.38, or may be about 0.37. The first plasma treatment on the deposited barrier material of 50 Å may result in a low density barrier material or a layer of a bilayer (e.g., a bulk layer) with an atomic ratio between 1.32 and 1.40, 1.33 and 1.39, 1.34 and 1.38, 1.35 and 1.37, or may be about 1.36. The second plasma treatment on the deposited barrier material of 50 Å may result in a low density barrier material or a layer of a bilayer (e.g., a bulk layer) with an atomic ratio between 1.99 and 2.07, 2.00 and 2.06, 2.01 and 2.05, 2.02 and 2.04, or may be about 2.03.

Additionally or alternatively, the type of plasma treatment and/or the thickness of the deposited barrier material may affect proportions of silicon, tungsten, nitrogen, or a combination thereof in the low density barrier material or a layer of a bilayer. For instance, a first plasma treatment may result in a proportion of $W_P SiN_Q$ and a second plasma treatment may result in a proportion of $W_R SiN_S$, where P and R may refer to proportions of tungsten atoms relative to silicon atoms in the low density barrier material. Q and S may refer to proportions of nitrogen atoms relative to silicon atoms in the low density barrier material. P may not be equal to R and Q may not be equal to S. In general, P and R may range from 0.5 to 2.0 and Q and S may range from 0.5 to 2.0.

In general, the deposited barrier material may have a density within a range of density values (e.g., between 6.7 g/cc and 7.7 g/cc, 6 g/cc and 9.2 g/cc, or 6 g/cc and 7.5 g/cc) which may be at least partially due to the PVD process capability and repeatability. In some cases, a lower-bound density of the range of density values may range between 5.5 g/cc and 6.5 g/cc, 5.6 g/cc and 6.4 g/cc, 5.7 g/cc and 6.3 g/cc, 5.8 g/cc and 6.2 g/cc, 5.6 g/cc and 6.1 g/cc, or may be about 6 g/cc. In some cases, a lower-bound density of the range of density values may range between 6.2 g/cc and 7.2 g/cc, 6.3 g/cc and 7.1 g/cc, 6.4 g/cc and 7.0 g/cc, 6.5 g/cc and 6.9 g/cc, 6.6 g/cc and 6.8 g/cc, or may be about 6.7 g/cc. In some cases, an upper-bound density of the range of density values may range between 7.2 g/cc and 8.2 g/cc, 7.3 g/cc and 8.1 g/cc, 7.4 g/cc and 8.0 g/cc, 7.5 g/cc and 7.9 g/cc, 7.6 g/cc and 7.8 g/cc, or may be about 7.7 g/cc. In some cases, an upper-bound density of the range of density values may range between 8.7 g/cc and 9.7 g/cc, 8.8 g/cc and 9.6 g/cc, 8.9 g/cc and 9.5 g/cc, 9.0 g/cc and 9.5 g/cc, 9.1 g/cc and 9.3 g/cc, or may be about 9.2 g/cc. Additionally, the range may be limited by an increasing difficulty in controlling resistivity (e.g., thermal or electrical) as an amount of dinitrogen within the PVD plasma (e.g., a dinitrogen flow) increases.

The low density barrier material may also have a density within a range of density values (e.g., between 3.5 g/cc and 5 g/cc). A lower-bound density of the range of density values for the low density barrier material or a layer of a bilayer (e.g., a bulk layer) may range between 3.0 g/cc and 4.0 g/cc, 3.1 g/cc and 3.9 g/cc, 3.2 g/cc and 3.8 g/cc, 3.3 g/cc and 3.7 g/cc, 3.4 g/cc and 3.6 g/cc, or may be about 3.5 g/cc. An upper-bound density of the range of density values for the low density barrier material or a layer of a bilayer may range between 4.5 g/cc and 5.5 g/cc, 4.6 g/cc and 5.4 g/cc, 4.7 g/cc and 5.3 g/cc, 4.8 g/cc and 5.2 g/cc, 4.9 g/cc and 5.1 g/cc, or may be about 5 g/cc. Applying plasma treatments may affect the density of the low density barrier material or a layer of a bilayer (e.g., a bulk layer) to be below the range of density values for the deposited barrier material, which may decrease the thermal conductivity associated with the low density barrier material relative to the deposited barrier material.

At 420, a plasma may be applied to the deposited barrier material. The plasma may be made from a gas composed of dinitrogen and helium molecules. The plasma may be applied for anywhere within a range of time durations (e.g., 50 seconds to 100 seconds). A lower-bound of the range of time durations may range between 46 seconds and 54 seconds, 47 seconds and 53 seconds, 48 seconds and 52 seconds, 49 seconds and 51 seconds, or may be about 50 seconds. An upper-bound of the range of time durations may range between 96 seconds and 104 seconds, 97 seconds and 103 seconds, 98 seconds and 102 seconds, 99 seconds and 101 seconds, or may be about 100 seconds. Additionally, the plasma treatment may be associated with a power anywhere within a range of power values of 1 kW and 2 kW. A lower-bound power of the range of power values may range between 0.6 kilowatts (kW) and 1.4 kW, 0.7 kW and 1.3 kW, 0.8 kW and 1.2 kW, 0.9 kW and 1.1 kW, or may be about 1.0 kW. Additionally or alternatively, the lower-bound power of the range of power values may be a value equal to or greater than 0.1 kW or 0.5 kW. An upper-bound power of the range of power values may range between 1.6 kW and 2.4 kW, 1.7 kW and 2.3 kW, 1.8 kW and 2.2 kW, 1.9 kW and 2.1 kW, or may be about 2.0 kW. Additionally or alternatively, the upper bound may be a value equal to greater than 2.0 kW. In some cases, the plasma applied at 420 may be the same as the plasma applied at 405. In some cases, the plasma may be applied based on a target resistivity (e.g., thermal or electrical) of the low density barrier material.

At 425, a low density barrier material may be formed on the exposed surface of the deposited barrier material. The low density barrier material may be formed due to a higher percentage of nitrogen being present at the surface after treatment by the second plasma. Additionally or alternatively, the low density barrier material may be formed due to tungsten being pulled to a surface of the low density barrier material, which may form a bilayer. A first layer of the bilayer, at the surface, may be denser than a second layer of the bilayer that is adjacent to the first layer, which may be due to the tungsten being pulled to the denser layer of the bilayer. The second layer may be less dense than the deposited barrier material and the first layer may be less dense, as dense, or denser than the deposited barrier material. The bilayer may have an overall density smaller than the deposited barrier material.

Figure 5A:
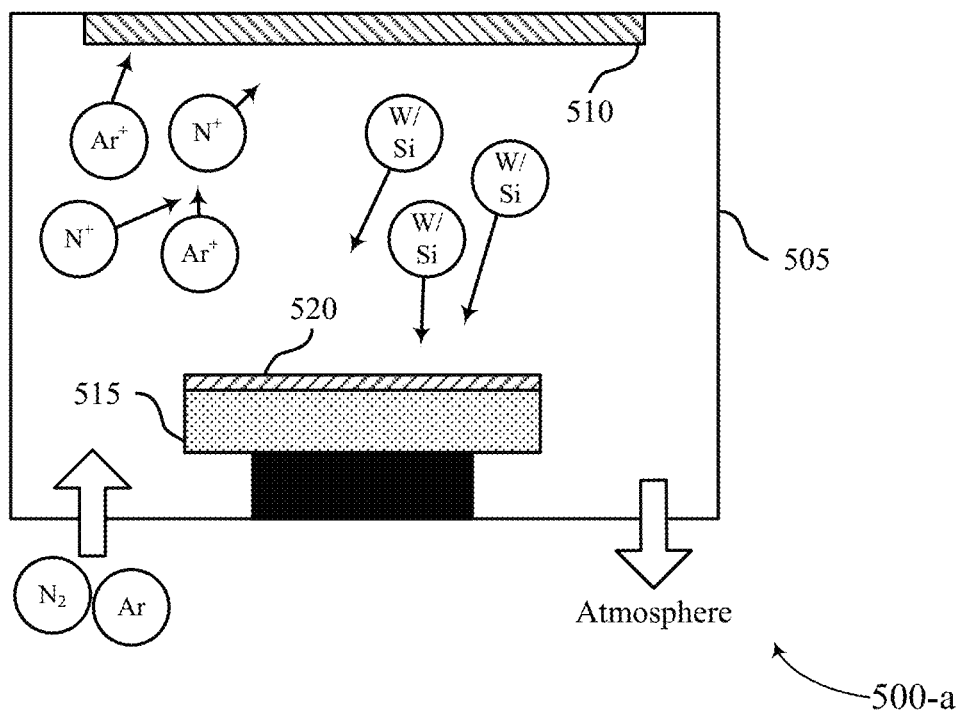
FIGS. 5A and 5B illustrate examples of plasma application processes that support a memory device with a low density thermal barrier in accordance with examples as disclosed herein.
Figure 5B:
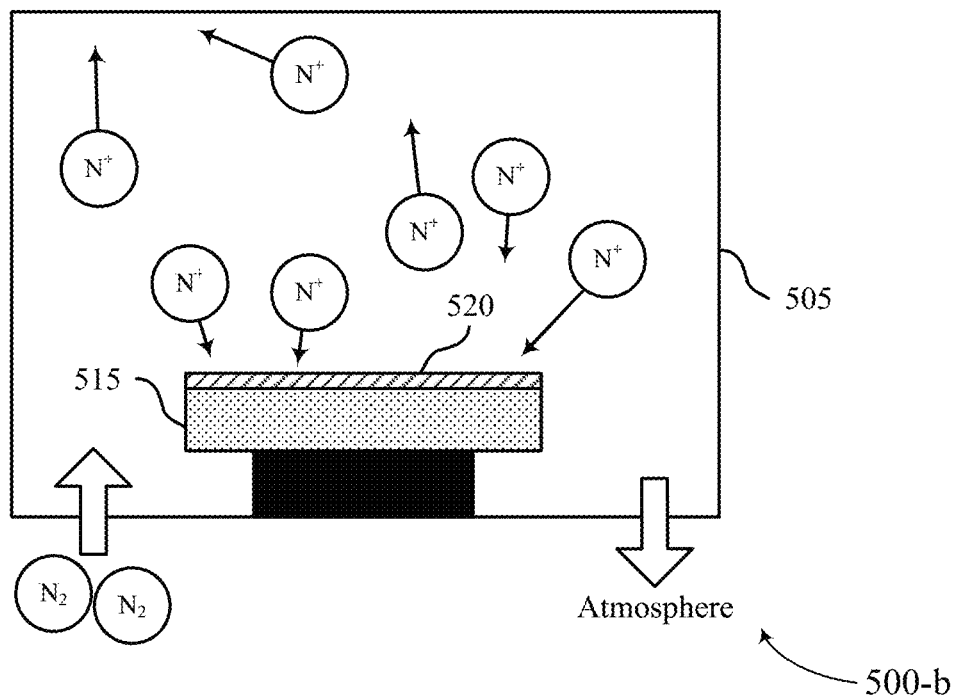

FIGS. 5A and 5B illustrate examples of plasma application processes 500-*a* and 500-*b* that support a memory device with a low density thermal barrier in accordance with examples of the present disclosure. In some examples, plasma application processes 500-*a* and 500-*b* may implement examples of manufacturing process 400. For instance, plasma application process 500-*a* may depict an example of 405 as described with reference to FIG. 4. Plasma application process 500-*b*, meanwhile, may depict an example of 410 and 420 as described with reference to FIG. 4.

With regards to plasma application process 500-*a*, atmospheric molecules (e.g., air) may be pumped out of the deposition chamber 505 to create a vacuum. Dinitrogen and argon in gaseous form may enter the deposition chamber 505 and fill the vacuum. The dinitrogen and argon may receive thermal energy (e.g., the dinitrogen and argon may be heated up) until a plasma made up of nitrogen and argon ions is formed. The nitrogen and argon ions may contact the target barrier material 510 (e.g., a WSi$_X$ material with 2≤X≤4) and may knock tungsten and silicon molecules out of the target barrier material 510. The tungsten and silicon molecules may drop to the exposed surface of the semi-conductor substrate 515 and may begin to form barrier material 520 (e.g., WSiN). As barrier material 520 begins to form, tungsten and silicon molecules may begin to drop onto the exposed surface of barrier material 520 and increase thickness of barrier material 520. The semiconductor substrate may be on a temperature-controlled platen.

With regards to plasma application process 500-*b*, atmospheric molecules, such as air, may be pumped out of the deposition chamber 505 to create a vacuum. Dinitrogen and, in some cases, helium may enter the deposition chamber 505 and fill the vacuum. The dinitrogen may receive thermal energy (e.g., the dinitrogen may be heated up using thermal or with radio frequency (RF) radiation) until a plasma made up of nitrogen ions is formed. If helium also entered the deposition chamber 505, the plasma may also include helium ions. The nitrogen ions may contact the surface of the barrier material 520, pull tungsten outwards, and bond with the tungsten. This process may continue until a low density barrier material (e.g., a low density barrier material such as low density barrier material 305 as described with reference to FIG. 3) is formed on the surface of the barrier material 520 or, in cases where all of the barrier material 520 becomes low density barrier material, on the surface of the semi-conductor substrate 515. In some cases, plasma application process 500-*b* may be referred to as CVD nitridation.

Figure 6:
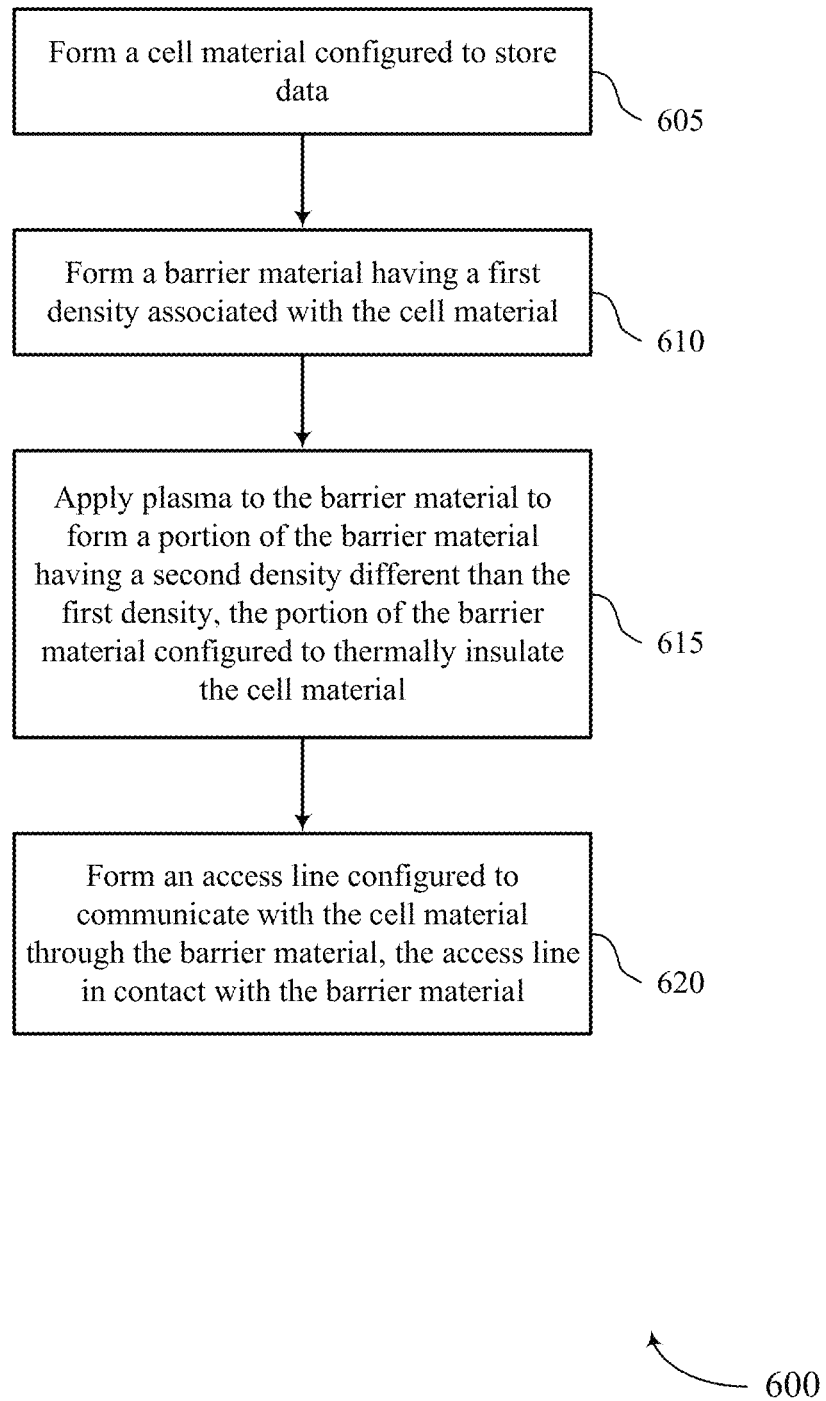
FIGS. 6 through 9 show flowcharts illustrating methods that support a memory device with a low density thermal barrier in accordance with examples as disclosed herein.

FIG. 6 shows a flowchart illustrating a method 600 that supports a memory device with a low density thermal barrier in accordance with examples of the present disclosure. The operations of method 600 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware. In some examples, a controller implementing the operations of method 600 may be for controlling a deposition control chamber as described with reference to FIGS. 4 and 5.

At 605, the method 600 may include forming a cell material configured to store data. The operations of 605 may be performed according to the methods described herein.

At 610, the method 600 may include forming a barrier material having a first density associated with the cell material. The operations of 610 may be performed according to the methods described herein.

At 615, the method 600 may include applying plasma to the barrier material to form a portion of the barrier material having a second density different than the first density, the portion of the barrier material configured to thermally insulate the cell material. The operations of 615 may be performed according to the methods described herein.

At 620, the method 600 may include forming an access line configured to communicate with the cell material through the barrier material, the access line in contact with the barrier material. The operations of 620 may be performed according to the methods described herein.

In some examples, an apparatus as described herein may perform a method or methods, such as the method 600. The apparatus may include features, means, or instructions for forming a cell material configured to store data; forming a barrier material having a first density associated with the cell material; applying plasma to the barrier material to form a portion of the barrier material having a second density different than the first density, the portion of the barrier material configured to thermally insulate the cell material; and forming an access line configured to communicate with the cell material through the barrier material, the access line in contact with the barrier material.

In some examples of the method 600 and the apparatus described herein, performing the operation further may include operations, features, means, or instructions for forming a first conductive material in contact with the cell material and the barrier material, where the barrier material is configured to isolate the first conductive material from a material of the access line. In some examples of the method 600 and the apparatus described herein, the barrier material includes a barrier material configured to limit diffusion between the first conductive material and the material of the access line.

In some examples of the method 600 and the apparatus described herein, the first conductive material is in contact with the portion of the barrier material that includes the second density and the access line includes a word line. In some examples of the method 600 and the apparatus described herein, the second density is less than the first density. In some examples of the method 600 and the apparatus described herein, the access line is in contact with the portion of the barrier material and includes a digit line. In some examples of the method 600 and the apparatus described herein, performing the operation further may include operations, features, means, or instructions for exposing the barrier material to air before applying the plasma to the barrier material.

In some examples of the method 600 and the apparatus described herein, the barrier material includes tungsten silicon nitride. In some examples of the method 600 and the apparatus described herein, performing the operation further may include operations, features, means, or instructions for determining a proportion of silicon, tungsten, nitrogen, or any combination thereof in the portion of the barrier material; determining an amount of dinitrogen in the plasma based on the proportion; and applying the plasma to the barrier material based on determining the amount of dinitrogen or a resistivity of the barrier material.

In some examples of the method 600 and the apparatus described herein, a gas associated with the plasma includes dinitrogen. In some examples of the method 600 and the apparatus described herein, the gas includes helium.

Figure 7:
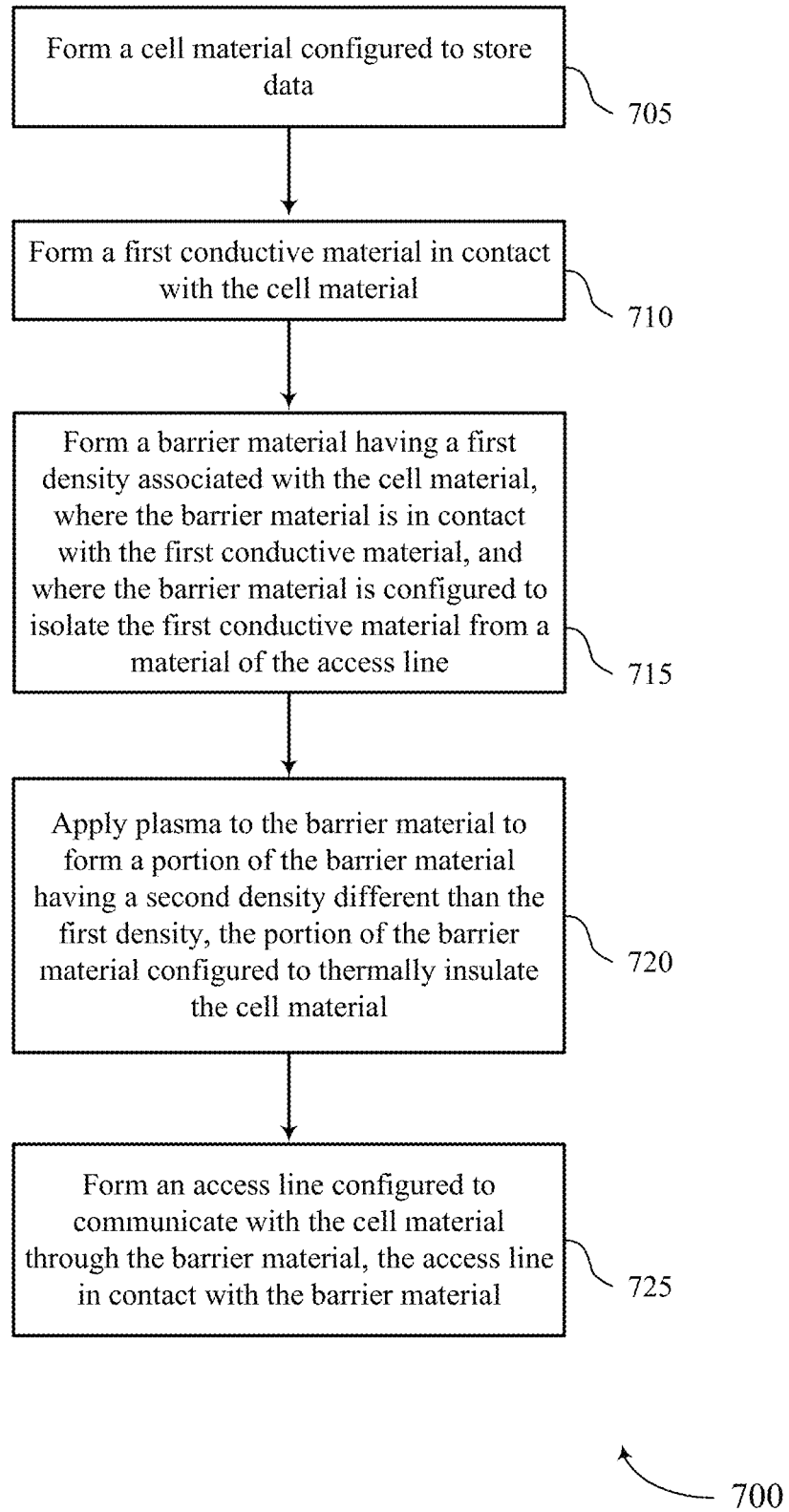

FIG. 7 shows a flowchart illustrating a method 700 that supports a memory device with a low density thermal barrier in accordance with examples of the present disclosure. The operations of method 700 may be implemented by a manufacturing system or one or more controllers associated with the manufacturing system. In some examples, one or more controllers may execute a set of instructions to control the functional elements of the manufacturing system to perform the functions described below. Additionally or alternatively, one or more controllers may perform portions of the functions described below using special-purpose hardware. In some examples, a controller implementing the operations of method 700 may be for controlling a deposition chamber as described with reference to FIGS. 4 and 5.

At 705, the method 700 may include forming a cell material configured to store data. The operations of 705 may be performed according to the methods described herein.

At 710, the method 700 may include forming a first conductive material in contact with the cell material. The operations of 710 may be performed according to the methods described herein.

At 715, the method 700 may include forming a barrier material having a first density associated with the cell material, where the barrier material is in contact with the first conductive material, and where the barrier material is configured to isolate the first conductive material from a material of the access line. The operations of 715 may be performed according to the methods described herein.

At 720, the method 700 may include applying plasma to the barrier material to form a portion of the barrier material having a second density different than the first density, the portion of the barrier material configured to thermally insulate the cell material. The operations of 720 may be performed according to the methods described herein.

At 725, the method 700 may include forming an access line configured to communicate with the cell material through the barrier material, the access line in contact with the barrier material. The operations of 725 may be performed according to the methods described herein.

Figure 8:
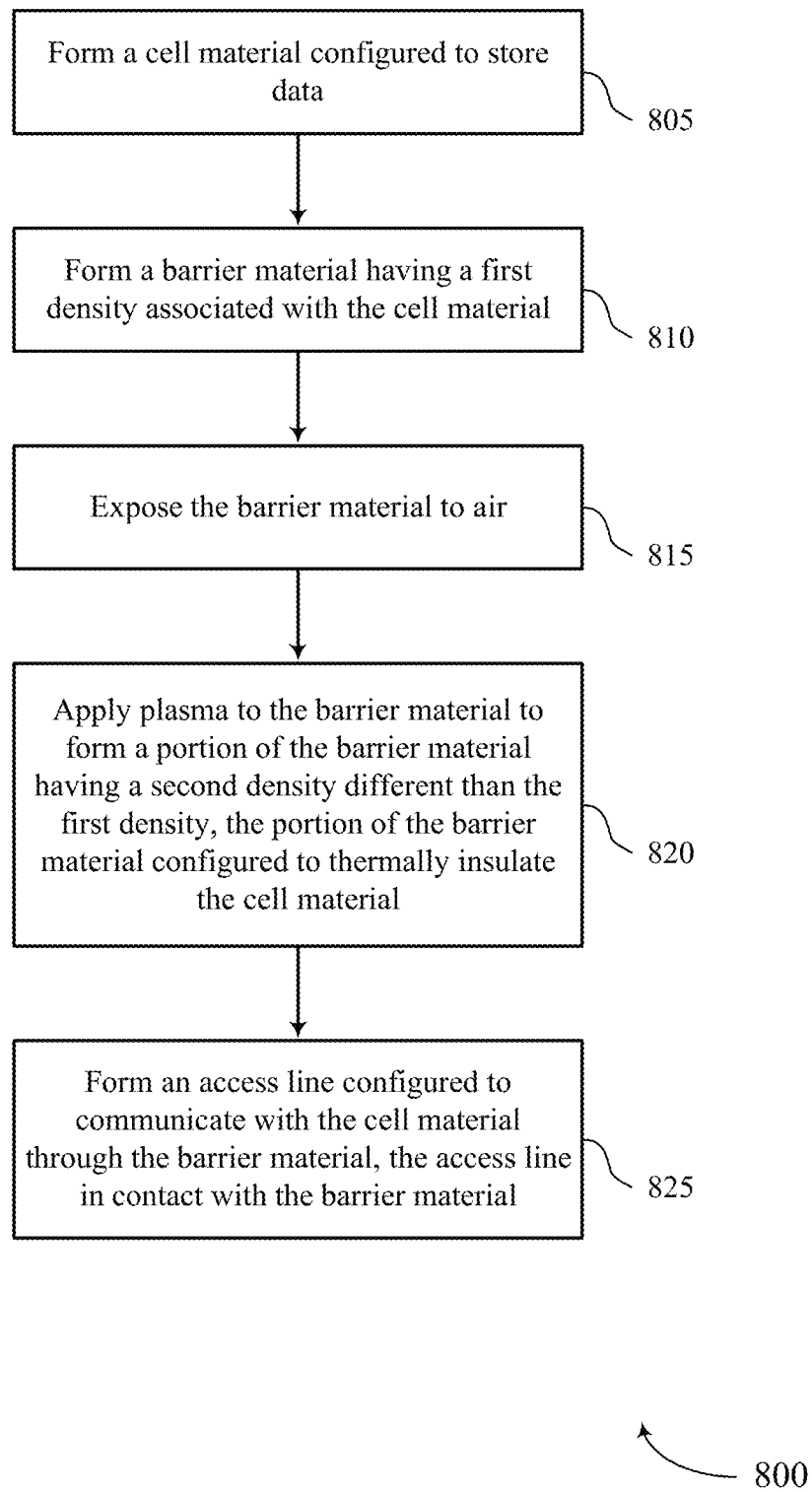

FIG. 8 shows a flowchart illustrating a method 800 that supports a memory device with a low density thermal barrier in accordance with examples of the present disclosure. The operations of method 800 may be implemented by a manufacturing system or one or more controllers associated with the manufacturing system. In some examples, one or more controllers may execute a set of instructions to control the functional elements of the manufacturing system to perform the functions described below. Additionally or alternatively, one or more controllers may perform portions of the functions described below using special-purpose hardware. In some examples, a controller implementing the operations of method 800 may be for controlling a deposition chamber as described with reference to FIGS. 4 and 5.

At 805, the method 800 may include forming a cell material configured to store data. The operations of 805 may be performed according to the methods described herein.

At 810, the method 800 may include forming a barrier material having a first density associated with the cell material. The operations of 810 may be performed according to the methods described herein.

At 815, the method 800 may include exposing the barrier material to air. The operations of 815 may be performed according to the methods described herein.

At 820, the method 800 may include applying plasma to the barrier material to form a portion of the barrier material having a second density different than the first density, the portion of the barrier material configured to thermally insulate the cell material. The operations of 820 may be performed according to the methods described herein.

At 825, the method 800 may include forming an access line configured to communicate with the cell material through the barrier material, the access line in contact with the barrier material. The operations of 825 may be performed according to the methods described herein.

Figure 9:
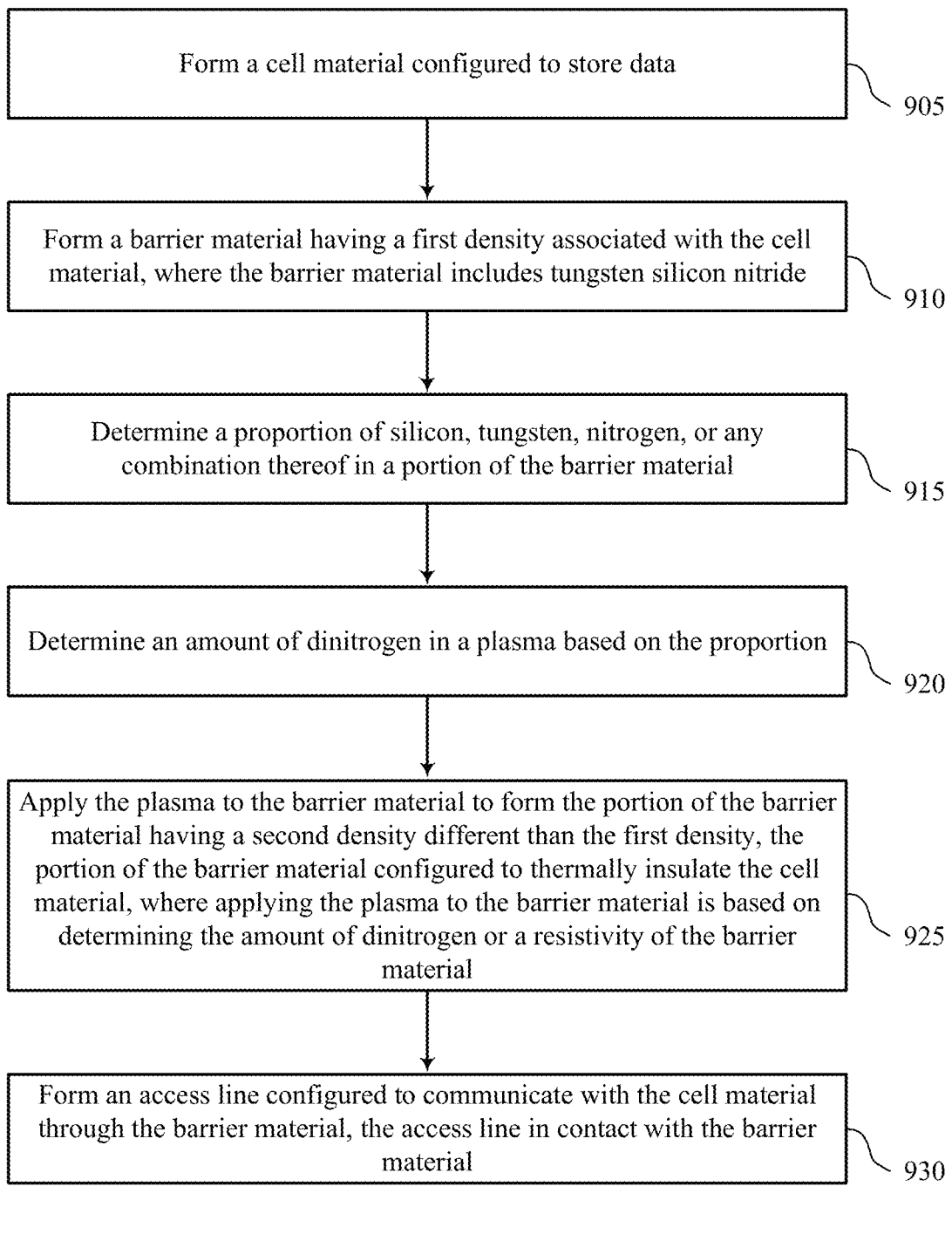

FIG. 9 shows a flowchart illustrating a method 900 that supports a memory device with a low density thermal barrier in accordance with examples of the present disclosure. The operations of method 900 may be implemented by a manufacturing system or one or more controllers associated with the manufacturing system. In some examples, one or more controllers may execute a set of instructions to control the functional elements of the manufacturing system to perform the functions described below. Additionally or alternatively, one or more controllers may perform portions of the functions described below using special-purpose hardware. In some examples, a controller implementing the operations of method 900 may be for controlling a deposition chamber as described with reference to FIGS. 4 and 5.

At 905, the method 900 may include forming a cell material configured to store data. The operations of 905 may be performed according to the methods described herein.

At 910, the method 900 may include forming a barrier material having a first density associated with the cell material. The operations of 910 may be performed according to the methods described herein.

At 915, the method 900 may include determining a proportion of silicon, tungsten, nitrogen, or any combination thereof in a portion of the barrier material. The operations of 915 may be performed according to the methods described herein.

At 920, the method 900 may include determining an amount of dinitrogen in a plasma based on the proportion. The operations of 920 may be performed according to the methods described herein.

At 925, the method 900 may include applying the plasma to the barrier material to form the portion of the barrier material having a second density different than the first density, the portion of the barrier material configured to thermally insulate the cell material, where applying the plasma to the barrier material is based on determining the amount of dinitrogen or a resistivity of the barrier material.

At 930, the method 900 may include forming an access line configured to communicate with the cell material through the barrier material, the access line in contact with the barrier material. The operations of 930 may be performed according to the methods described herein.

The methods described herein describe possible implementations, and that the operations and the steps may be rearranged or otherwise modified and that other implementations are possible. Further, portions from two or more of the methods may be combined.

An apparatus is described. The apparatus may include a first access line configured to communicate with a cell component; a first barrier material positioned between the cell component and the first access line, the first barrier material having a first density and configured to thermally insulate the cell component; and a second barrier material positioned between the cell component and a second access line, the second barrier material having a second density different than the first density and configured to thermally insulate the cell component. In some examples, the first density is less than the second density. In some examples, a resistivity of the first barrier material is different from the resistivity of the second barrier material.

Some examples may further include a first conductive material positioned between the first barrier material and the cell component, where the first barrier material is further configured to isolate the first conductive material from a material of the first access line, and a second conductive material positioned between the second barrier material and the cell component, where the second barrier material is further configured to isolate the second conductive material from a material of the second access line. In some examples, the first barrier material and the second barrier material comprise a same type of barrier material.

Another apparatus is described. The apparatus may include a first access line configured to communicate with a cell component; a first barrier positioned between the cell component and the first access line, the first barrier comprising a first portion comprising a first density of tungsten silicon nitride and a second portion comprising a second density of tungsten silicon nitride greater than the first density of tungsten silicon nitride; and a second barrier positioned between the cell component and a second access line, the second barrier comprising a third portion comprising a third density of tungsten silicon nitride and a fourth portion comprising a fourth density of tungsten silicon nitride greater than the third density of tungsten silicon nitride. In some examples, the first portion is configured to thermally insulate the cell component, and the third portion is configured to thermally insulate the cell component.

Some examples may further include a first conductive material positioned between the first barrier and the cell component, where the first barrier is further configured to isolate the first conductive material from a material of the first access line, and a second conductive material that is positioned between the second barrier and the cell component, where the second barrier is further configured to isolate the second conductive material from a material of the second access line. In some examples, the first barrier includes a fifth portion positioned between the first access line and the cell component, where the fifth portion comprises a fifth density of tungsten silicon nitride greater than the first density of tungsten silicon nitride.

In some examples, the first portion has a greater density of tungsten-nitrogen bonds than the second portion. In some examples, the first portion has a lower density of tungsten-silicon bonds than the second portion. In some examples, a density of the first portion is between 3.5 g/cc and 3.8 g/cc. In some examples, an atomic ratio of tungsten-nitrogen bonds to tungsten-silicon bonds for the first portion is between 0.45 and 0.55. In some examples, an atomic ratio of tungsten-nitrogen bonds to tungsten-silicon bonds for the first portion is between 1.3 and 2.1.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 102.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations thereof. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming a cell material configured to store data;
   forming a barrier material having a first density;
   applying plasma to the barrier material to form a portion of the barrier material having a second density different than the first density, the portion of the barrier material configured to thermally insulate the cell material; and
   forming an access line configured to communicate with the cell material through the barrier material, wherein the barrier material is positioned between the cell material and the access line.

2. The method of claim 1, further comprising:
   forming a first conductive material positioned between the cell material and the barrier material, wherein the barrier material is configured to isolate the first conductive material from a material of the access line.

3. The method of claim 2, wherein the barrier material comprises a diffusion barrier material configured to limit diffusion between the first conductive material and the material of the access line.

4. The method of claim 2, wherein:
   the first conductive material is in contact with the portion of the barrier material that comprises the second density; and
   the access line comprises a word line.

5. The method of claim 1, wherein the second density is less than the first density.

6. The method of claim 1, wherein the access line is in contact with the portion of the barrier material and comprises a digit line.

7. The method of claim 1, further comprising:
   exposing the barrier material to air before applying the plasma to the barrier material.

8. The method of claim 1, wherein the barrier material comprises tungsten silicon nitride.

9. The method of claim 8, further comprising:
   determining a proportion of silicon, tungsten, nitrogen, or any combination thereof in the portion of the barrier material;
   determining an amount of dinitrogen in the plasma based at least in part on the proportion; and
   applying the plasma to the barrier material based at least in part on determining the amount of dinitrogen or a resistivity of the barrier material.

10. The method of claim 1, wherein a gas associated with the plasma comprises dinitrogen.

11. The method of claim 10, wherein the gas further comprises helium.

* * * * *